US007002795B2

(12) United States Patent
Trautman et al.

(10) Patent No.: US 7,002,795 B2

(45) Date of Patent: Feb. 21, 2006

(54) LOW NOISE HEATSINK

(75) Inventors: Mark A. Trautman, Aloha, OR (US); George Daskalakis, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 199 days.

(21) Appl. No.: 10/609,103

(22) Filed: Jun. 26, 2003

(65) Prior Publication Data

US 2004/0264137 A1 Dec. 30, 2004

(51) Int. Cl.
*H05K 7/20* (2006.01)

(52) U.S. Cl. .................... 361/695; 165/80.2; 165/80.3; 165/185; 165/121; 165/905; 174/16.3; 257/706; 257/707; 257/712; 257/713; 257/722; 361/690; 361/704; 361/710; 361/703; 361/697

(58) Field of Classification Search ............... 165/80.2, 165/80.3, 185, 121, 122, 905; 176/16.3; 257/706–707, 712–713, 722; 361/687, 690, 361/703–722, 694–697; 174/16.3
See application file for complete search history.

(56) References Cited

U.S. PATENT DOCUMENTS 6,114,048 A * 9/2000 Jech et al. .................. 428/547
6,758,263 B1 * 7/2004 Krassowski et al. ........ 165/185

* cited by examiner

*Primary Examiner*—Gregory Thompson
(74) *Attorney, Agent, or Firm*—Paul E. Steiner

(57) ABSTRACT

A thermal management device includes a thermally conductive core, a thermally conductive frame positioned around the core, the frame defining at least one opening, and at least one thermally conductive insert disposed in the opening in the frame.

28 Claims, 5 Drawing Sheets

LOW NOISE HEATSINK

The invention relates to thermal management of electronic systems, and more particularly to a novel thermal management device.

BACKGROUND AND RELATED ART

Modern electronic devices such as computer systems have not only microprocessor chips, including Intel® i386, i486, Celeron™ or Pentium® processors, but also many other integrated circuits (ICs) and other electronic components, most of which are mounted on printed circuit boards (PCBs). Many of these components generate heat during normal operation. Components that have a relatively small number of functions in relation to their size, as for example individual transistors or small scale integrated circuits (ICs), usually dissipate all their heat without a heatsink. However, more complex components may dissipate an amount of heat which requires the assistance of external cooling devices such as heatsinks.

Heatsinks may be passive devices, for example an extruded aluminum plate with a plurality of fins, that is thermally coupled to a heat source, e.g. an electronic component such as a microprocessor, to absorb heat from the electronic component. The heatsinks dissipate this heat into the air primarily by convection.

Common materials for heatsinks include copper (Cu) or aluminum (Al) based heatsinks with either extruded, folded, or skived fins with no fan or with an active fan to promote airflow efficiency. A retention mechanism such as a clip is sometimes required to secure the heatsink onto an electronic package across the heat dissipation path. An active fan is often mounted on top of the heatsinks to transfer heat, during operation, from a heat source to the ambient air, via the fins.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

Figure 1:
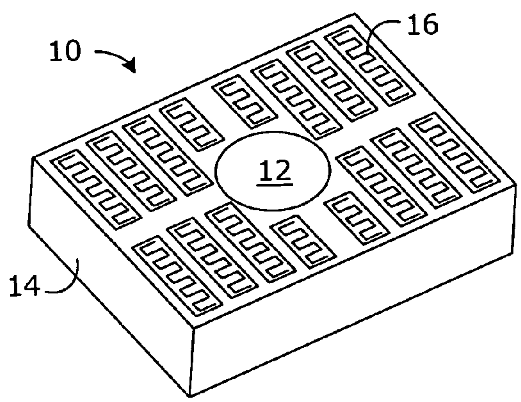
FIG. 1 is a perspective view of a heatsink according to some embodiments of the invention.
Figure 2:
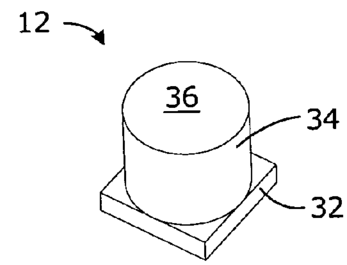
FIG. 2 is a perspective view of a core portion of the heatsink from FIG. 1.
Figure 3:
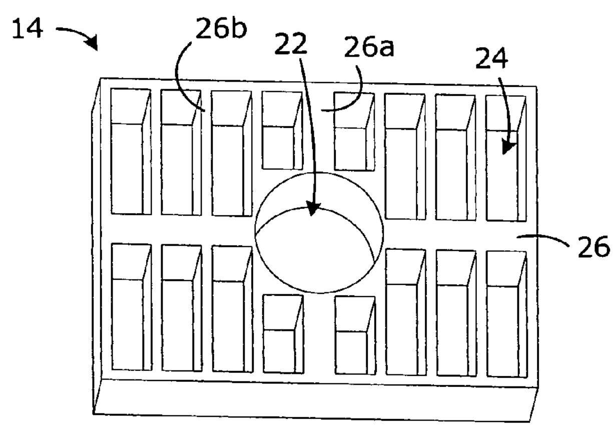
FIG. 3 is a perspective view of a support frame portion of the heatsink from FIG. 1.
Figure 4:
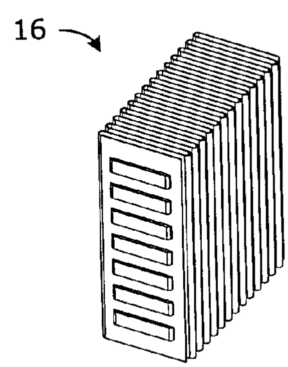
FIG. 4 is a perspective view of an insert portion of the heatsink from FIG. 1.

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Some heatsinks employ folded fin technology or skiving to achieve high aspect ratio fins. The fins are attached to a thermally conductive base that spreads heat from the microprocessor to the fins, and the fins dissipate the heat to the air stream. To achieve a low overall thermal resistance in a given volume, the spreading resistance of the heatsink base is balanced with the conduction and convection thermal resistance of the fins. Tall, high aspect ratio fins are required to achieve a large heat transfer area, however, the thinness of the fins is a barrier to heat conduction along their long length. Other heatsinks employ radial fins attached to a conductive cylindrical base to remove the heat from the microprocessor. However, limitations in high volume manufacturing techniques restrict the amount of exposed surface area that can be exposed to the embedding air stream (thus limiting heat transfer).

With reference to FIGS. 1–5, according to some embodiments of the invention, a heatsink 10 includes a thermally conductive core 12, a thermally conductive support frame 14, and thermally conductive inserts 16. The support frame 14 defines a first opening 22 which is sized to receive the core 12 and a plurality of second openings 24 which are respectively sized to receive the inserts 16. An optional fan (not shown) may be included to provide active cooling. For example, the fan may be mounted on top of the heatsink.

Figure 5:
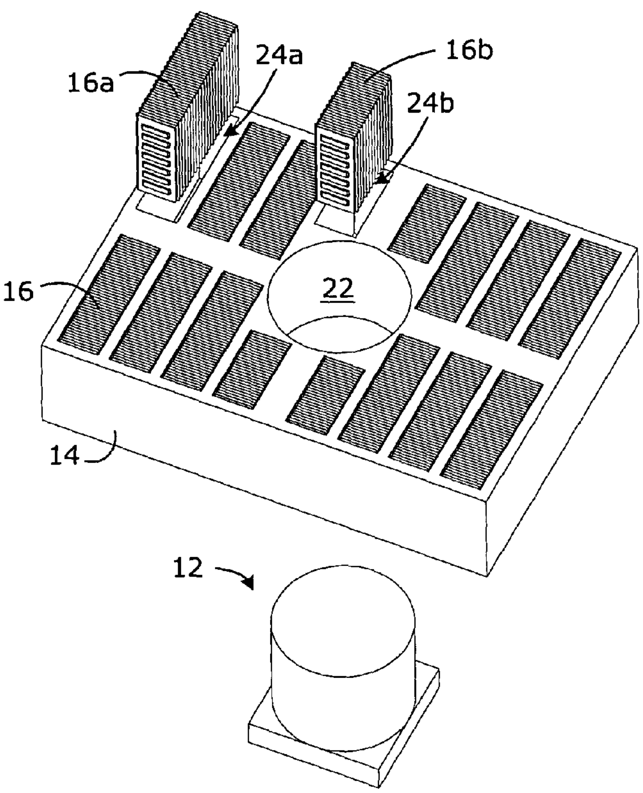
FIG. 5 is an exploded, perspective view the heatsink from FIG. 1.

With reference to FIG. 5, some embodiments of the invention are made by providing the thermally conductive core 12, the thermally conductive support frame 14, and the thermally conductive insert 16. The core 12 is positioned inside the first opening 22 in the frame 14 and secured thereto. The insert 16 is positioned inside the second opening 24 in the frame 14 and secured thereto. Preferably, the frame 14 defines a plurality of openings 24 adapted to receive a plurality of inserts 16. The openings 24 and inserts 16 are not necessarily identical. A relatively longer opening 24*a* may receive a relatively longer insert 16*a*, while a relatively shorter opening 24*b* may receive a relatively shorter insert 16*b*.

The support frame 14 acts as a backbone of the heatsink, providing support for the various other components of the assembly. The support frame 14 is made from thermally conductive material to distribute heat from the core 12 to the inserts 16. In some embodiments, the support frame 14 is made from aluminum. The frame 14 may be manufactured by any conventional manufacturing technique. Advantageously, for high volume manufacturing the frame 14 may be extruded.

The support frame 14 includes a plurality of thermally conductive members or spars 26 which extend outward from the core 12. As used herein, a spar refers to a member of the framework of conductive members making up the frame 14. The spars 26 function as thermal busses to carry heat from the core 12 to the inserts 16. The frame 14 may include primary spars 26*a* and secondary spars 26*b*, where the primary spars 26*a* are thicker relative to the secondary spars 26*b*. Providing a relatively thick support frame 14 allows for effective conduction of the heat from the core 12 to the inserts 16. Specifically, the spars 26 are sufficiently thick to conduct heat between the core 12 and the inserts 16 with little temperature drop (e.g. low thermal resistance). Advantageously, relatively thick spars 26 also support low cost manufacturing. Specifically, the spars 26 are sufficiently thick to permit extrusion tooling, which supports low production costs for high volume manufacturing.

In the example from FIGS. 1–5, the core 12 includes a base 32 and a post 34. The core 12 is made from thermally conductive material to distribute heat from the heat source to the support frame 14. In some examples, the core 12 is made from copper. The core 12 may be manufactured by any conventional manufacturing technique. For example, the core 12 may be machined, ground or impact extruded.

The base 32 of the core 12 functions as a heat spreader plate and may be sized as appropriate to interface with a heat generating area of a heat source. For example, the area of the base 32 may be sized to substantially cover an integrated circuit located inside an electronic package. The post 34 is sized to mate with the first opening 22 in the support frame 14 (e.g. an outer diameter of the post 34 is closely matched to an inner diameter of the opening 22). The post 34 may be assembled to the frame 14 by any of a variety of manufacturing processes including, for example, press-fit, thermal treatments, welding, brazing, and thermal adhesives. When assembled, a top surface 36 of the post 34 may be substantially flush with a top surface of the frame 14. The base 32 may optionally protrude beyond the other surface of the frame 14 to provide a gap between the heatsink 10 and the heat source (e.g. for air flow).

The inserts 16 are made from thermally conductive materials and preferably provide a relatively large surface area for efficient cooling. For example, the inserts 16 may include folded fin structures. The large surface area of the arrays of folded fin structures exposed to the air stream reduces the required amount of airflow, thus enabling low acoustic noise emission levels. The inserts 16 may include one or several of various effective geometries, examples of which include plate fins, offset strip fins, lanced fins, louvered fins and wavy fins. Other compact fin types and other thermally conductive structures may also be suitable. The high fin densities possible in some embodiments of the invention permit a high heat transfer surface area in a small volume.

The openings 24 in the frame 14 provide receptacles for the inserts 16. In some embodiments, the inserts 16 are relatively short in height (e.g. <1 inch high). For folded fins, the relatively short fin height allows for the manufacture of thin fins (e.g. about 0.002" thick) to be folded and inserted into the openings 24. Thin fins have a corresponding low air pressure drop across the fins, resulting in a lower fan power requirement and lower acoustic noise. In some embodiments, the fins may be staggered in the airflow direction which breaks up the boundary layer growth along the fin and promotes higher heat transfer rates. The fins may be attached to the openings 24 in the frame 14 by brazing, thermally conductive adhesives, or through the inherent spring force of the fins, among other conventional attachment techniques.

Figure 6:
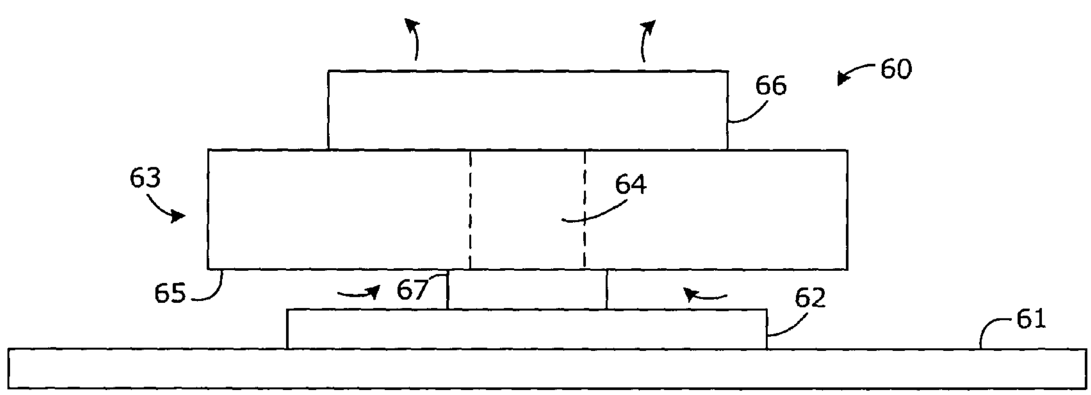
FIG. 6 is a schematic drawing of an electronic system utilizing a heatsink according to some embodiments of the invention.

With reference to FIG. 6, an electronic system 60 includes a substrate 61 with an electronic component 62 mounted on the substrate 61. For example, the substrate 61 may be a printed circuit board (e.g. a motherboard) and the electronic component 62 may be a microprocessor. A heatsink 63 is secured against and thermally coupled to the electronic component 62 for dissipating heat from the component 62. The heatsink 63 includes features according to various of the embodiments described herein. For example, the heatsink 63 includes the core 64, the frame 65, and the inserts. An optional cooling fan 66 provides active cooling for the system 60, including the component 62.

Appropriately configured, the heatsink 63 provides a high-performance, low acoustic noise emission, compact heatsink design for the thermal management of high power electronic devices. For example, the heatsink 63 may provide a large surface area and small channel dimensions that enable a high heat transfer coefficient that results in a small thermal resistance in a compact volume. Preferably, the frame 65 includes relatively thick spars to conduct heat from the core 64 to fine structured fins of the inserts that minimize the fin to air thermal resistance via a large surface area, small channel air passageways, and exposed edges to the oncoming air flow.

In some embodiments, the core 64 includes the base 67 which protrudes beyond the frame 65 and is thermally coupled to the electronic component 62. Because the base 67 protrudes, an air gap is provided between the frame 65 and the electronic component 62. The fan 66 can be configured such that the airflow impinges downward through the heatsink 63 to the electronic component 62. Alternatively, in some embodiments a lower resistance may be achieved if the fan 66 is configured such that the air flow is drawn up from the base 67 of the heatsink 63 through the heatsink 63 outward from the electronic component 62 (e.g. in the direction of the arrows in FIG. 6). With this air flow orientation the cooler air enters at the hotter part of the heatsink 63 (e.g. near the base 67) creating a potentially larger temperature difference between the heat transfer surface and the air stream. The larger temperature differential increases the ability of the heatsink 63 to dissipate heat, and therefore results in a lower thermal resistance.

Figure 7:
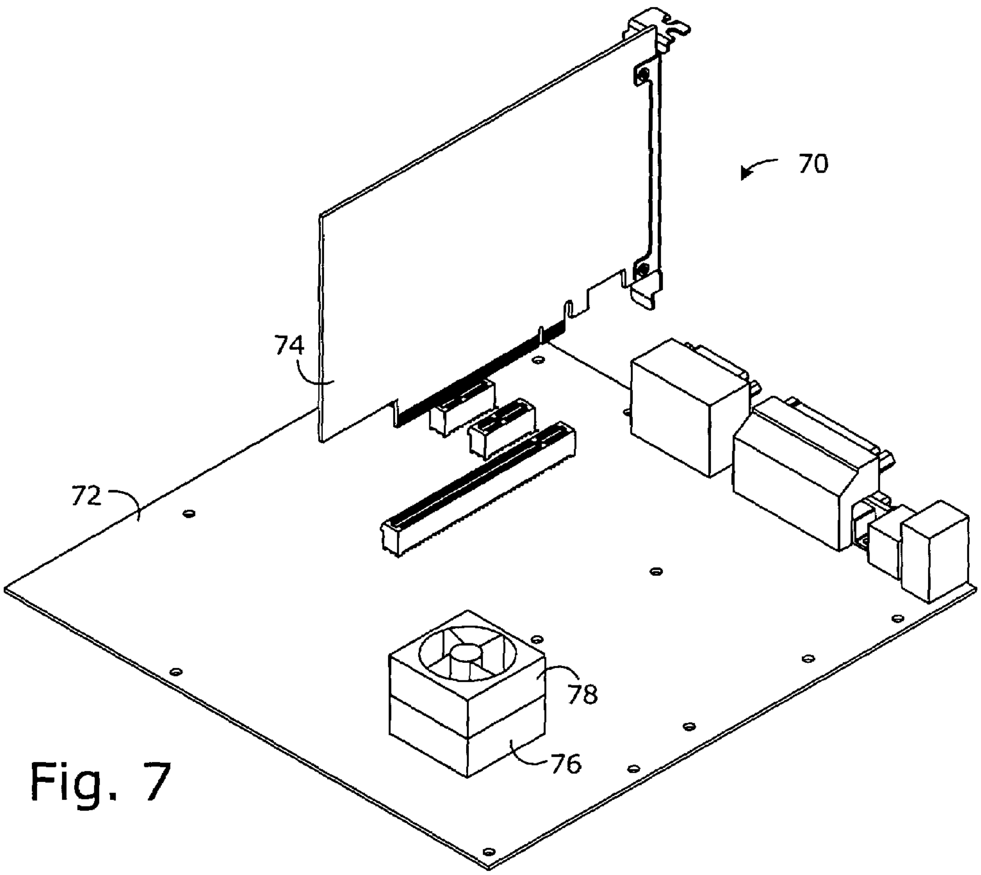
FIG. 7 is a perspective view of another electronic system utilizing a heatsink according to some embodiments of the invention.

With reference to FIG. 7, an electronic system 70 includes a circuit board 72 with a plurality of electronic components mounted on the circuit board 72. The circuit board 72 includes a connector mounted to the circuit board 72 and adapted to receive a circuit card 74 (e.g. a peripheral card or an expansion card). A heatsink 76 is secured against at least one of the electronic components (e.g. under the heatsink 76). The heatsink 76 includes features according to various of the embodiments described herein. For example, the heatsink 76 includes the core, the frame, and the inserts. An optional cooling fan 78 provides active cooling for the system 70, including the component under the heatsink 76. Preferably, the heatsink 76 uses a high efficiency, compact fin geometry for the inserts combined with the thermally conductive frame to effect low thermal resistance values (° C./W) in a small spatial volume. The thermally conductive core may include the protruding base and channels heat from the electronic device (e.g. a microprocessor) to the frame and low thermal resistance fin array. The large surface area of the fin array exposed to the air stream minimizes the required amount of airflow, thus driving low acoustic noise emission levels. Advantageously, the heatsink 76 may enable lower junction temperatures at high power dissipation by providing a low thermal resistance heatsink between the microprocessor device and the air stream. Preferably, the heatsink 76 accomplishes this advantage with a small volume, low mass device having low acoustic noise emissions.

Figure 8:
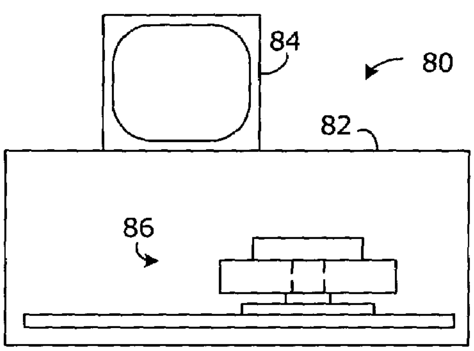
FIG. 8 is a schematic drawing of another electronic system utilizing a heatsink according to some embodiments of the invention.

With reference to FIG. 8, a computer system 80 includes an enclosure 82 and a display 84. A system board 86 is disposed inside the enclosure 82. For example, the system board 86 may be a motherboard for a desktop or laptop computer. For example, the system board 86 may be similar to the electronic system 60 described in connection with FIG. 6. The system board 86 includes a microprocessor which is thermally coupled to a heatsink including a thermally conductive core, frame, and inserts as described herein. The microprocessor and heatsink are actively cooled by a fan. Acoustics and space claim around the microprocessor are becoming increasingly important in personal computer (PC) packaging as the market for small, quiet, performance systems increases. Some embodiments of the invention provide a compact heatsink which uses a relatively low height fin structure to obtain high surface area in a small volume, reducing the airflow requirement (minimizes acoustic noise), and advancing the performance levels compared to the heatsinks the present state of the art.

Figure 9:
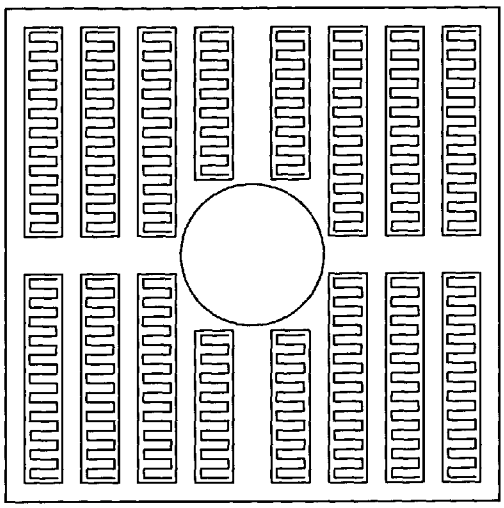
FIG. 9 is a top, schematic drawing of another heatsink according to some embodiments of the invention.
Figure 10:
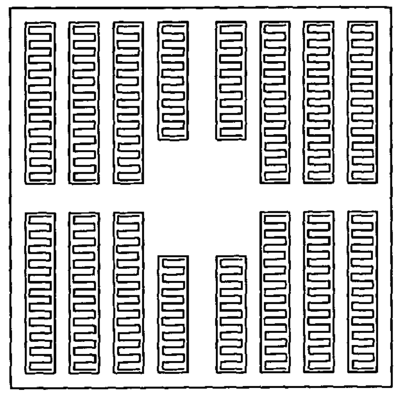
FIG. 10 is a top, schematic drawing of another heatsink according to some embodiments of the invention.
Figure 11:
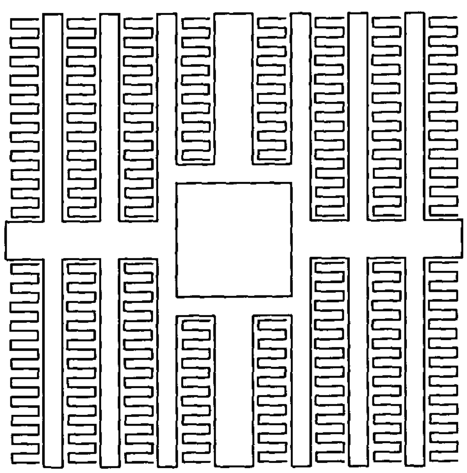
FIG. 11 is a top, schematic drawing of another heatsink according to some embodiments of the invention.
Figure 12:
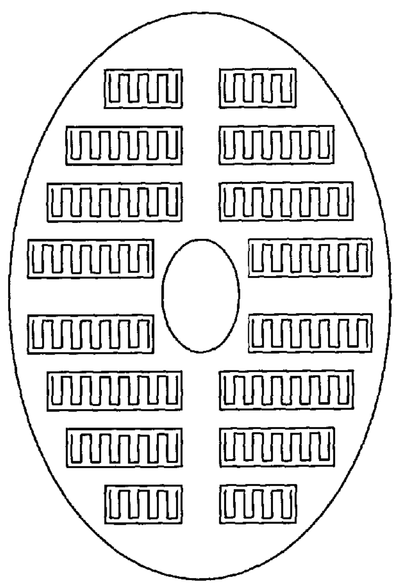
FIG. 12 is a top, schematic drawing of another heatsink according to some embodiments of the invention.

With reference to FIGS. 9–12, several non-limiting alternative examples of heatsink configurations are depicted according to some embodiments of the invention. In FIG. 9, the outer shape of the heatsink is substantially square which may be advantageous for mounting to various commercially available fans. In FIG. 10, the core is made monolithic with the frame. A monolithic core provides the advantage of eliminating a part from the assembly, with a possible trade-off in terms of choice of materials, thermal conductivity, and/or cost. In FIG. 11, the outer members of the frame are eliminated, providing potential advantages in terms of lower weight and cost. Also, a square shaped core is illustrative of the variety of arbitrary core shapes possible for the heatsink. In FIG. 12, an elliptical shaped heatsink (with an elliptical core) is illustrative of the variety of arbitrary shapes possible for the heatsink, as might be appropriate for different electronic systems.

Advantageously, some embodiments of the invention incorporate a combination of manufacturing technologies to produce a geometry that increases the heat transfer surface area and heat transfer coefficient, thus producing a low thermal resistance. By reducing the convective resistance, a small volume, low-mass heatsink is provided. For example, some embodiments of the invention may use copper for the core (for high thermal conductivity), extruded aluminum for the frame (for low cost and light weight), and thin, low height folded fins for the inserts (for low air pressure drop and low noise). In some embodiments, the compact fin structures create a large surface area and high heat transfer rates at these surfaces, the core structure minimizes the heat spreading resistance from the discrete size electronic component (e.g. microprocessor) to the frame, and the frame acts as a good intermediary conduction path that transports the heat from the thick core to the fine, compact fin structures.

Figure 13:
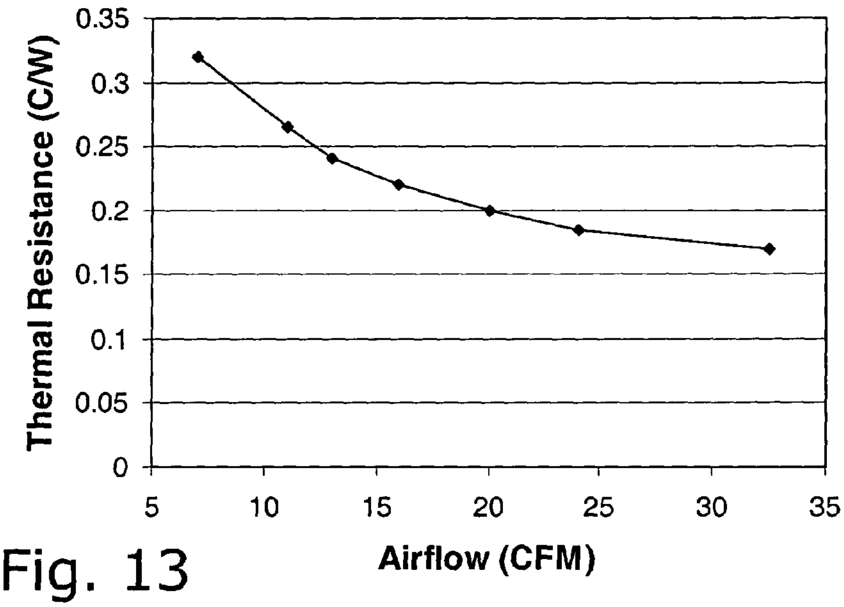
FIG. 13 is a graph of thermal resistance versus airflow according to some embodiments of the invention.
Figure 14:
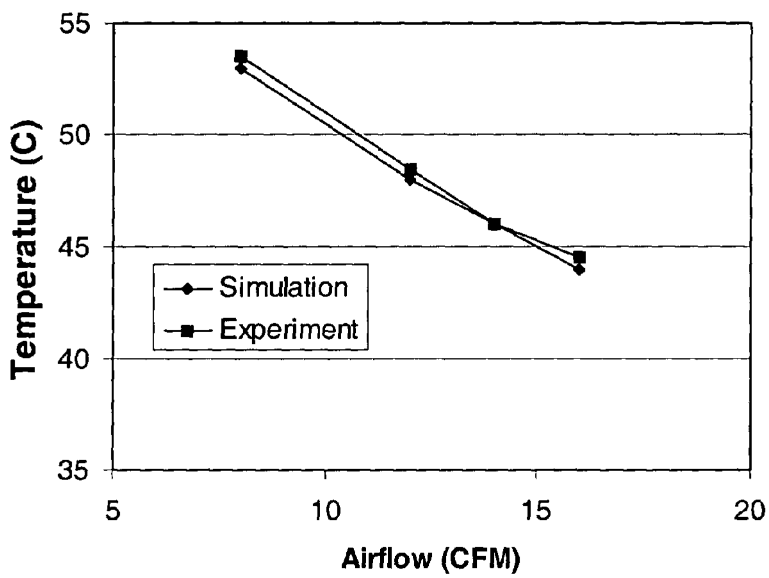
FIG. 14 is a graph of reference temperature versus airflow according to some embodiments of the invention.

With reference to FIGS. 13–14, the graphs include the results of computational fluid dynamics (CFD) simulations. For reference the thermal resistance of a an Intel Corporation Pentium 4™ processor is around 0.32° C./W. For the simulation, cool airflow enters at the base of the heatsink where the heatsink has its highest temperature and airflow exhausts topside through an attached fan. FIG. 13 shows the thermal resistance of the compact heatsink assembly as predicted by CFD simulations. FIG. 14 shows reference temperature versus airflow for both a simulation and experimentally measured system. The graph indicates good correlation between simulated and experimental results.

The foregoing and other aspects of the invention are achieved individually and in combination. The invention should not be construed as requiring two or more of the such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. An apparatus, comprising:

a thermally conductive core;

a thermally conductive frame positioned around the core, the frame defining at least one opening; and at least one thermally conductive insert disposed in the opening in the frame, wherein the core includes a post and base, with the base protruding from the frame.

2. The apparatus of claim 1, wherein the frame defines an opening adapted to receive the core and the core is disposed inside the opening adapted to receive the core.

3. The apparatus of claim 1, wherein the core and frame are monolithic.

4. An apparatus, comprising:

a thermally conductive core;

a thermally conductive frame positioned around the core, wherein the frame includes a framework of members defining an array of openings; and a plurality of thermally conductive inserts respectively disposed in the openings in the frame.

5. The apparatus of claim 4, wherein the framework includes a primary member and a secondary member, wherein the primary member is thicker than the secondary member.

6. An apparatus, comprising:

a thermally conductive core;

a thermally conductive frame positioned around the core, the frame defining at least one opening; and at least one thermally conductive insert disposed in the opening in the frame, wherein the at least one insert includes at least one insert having a folded fin structure.

7. The apparatus of claim 6, wherein:

the core comprises a copper post; and the frame comprises extruded aluminum.

8. A method, comprising:

providing a thermally conductive core;

positioning a thermally conductive frame around the core, the frame defining at least one opening; and inserting a thermally conductive insert in the opening in the frame, wherein the core includes a post and base, with the base protruding from the frame.

9. The method of claim 8, wherein the frame defines an opening adapted to receive the core and the positioning comprises securing the core inside the opening adapted to receive the core.

10. The method of claim 8, wherein the core and frame are monolithic.

11. A method, comprising:

providing a thermally conductive core;

positioning a thermally conductive frame around the core, wherein the frame includes a framework of members defining an array of openings; and inserting a plurality of thermally conductive inserts in respective openings of the array of openings.

12. The method of claim 11, wherein the framework includes a primary member and a secondary member, wherein the primary member is thicker than the secondary member.

13. A method, comprising:

providing a thermally conductive core;

positioning a thermally conductive frame around the core, the frame defining at least one opening; and inserting a thermally conductive insert in the opening in the frame, wherein the insert includes an insert having a folded fin structure.

14. The method of claim 13, wherein:

the core comprises a copper post;

the frame comprises extruded aluminum.

15. A system, comprising:

a heatsink assembly, comprising:

a thermally conductive core;

a thermally conductive frame positioned around the core, the frame defining at least one opening, wherein the core includes a post and base, with the base protruding from the frame;

at least one thermally conductive insert disposed in the opening in the frame; and an electronic component thermally coupled to the core of the heatsink.

16. The system of claim 15, wherein the frame defines an opening adapted to receive the core and the core is disposed inside the opening adapted to receive the core.

17. The system of claim 15, wherein the electronic component is thermally coupled to the protruding base of the core, providing an air gap between the electronic component and the heatsink.

18. The system of claim 15, further comprising a fan mounted to the heatsink and configured to draw air through the heatsink outward from the electronic component.

19. The system of claim 15, wherein the core and frame are monolithic.

20. A system, comprising:

a heatsink assembly, comprising:

a thermally conductive core;

a thermally conductive frame positioned around the core, wherein the frame includes a framework of members defining an array of openings;

a plurality of thermally conductive inserts respectively disposed in the openings in the frame; and an electronic component thermally coupled to the core of the heatsink.

21. The system of claim 20, wherein the framework includes a primary member and a secondary member, wherein the primary member is thicker than the secondary member.

22. A system, comprising:

a heatsink assembly, comprising:

a thermally conductive core;

a thermally conductive frame positioned around the core, the frame defining at least one opening;

at least one thermally conductive insert disposed in the opening in the frame; and an electronic component thermally coupled to the core of the heatsink, wherein the at least one insert includes at least one insert having a folded fin structure.

23. The system of claim 22, wherein:

the core comprises a copper post;

the frame comprises extruded aluminum.

24. A system, comprising:

a heatsink assembly, comprising:

a thermally conductive core;

a thermally conductive frame positioned around the core, the frame defining at least one opening;

at least one thermally conductive insert disposed in the opening in the frame;

an electronic component thermally coupled to the core of the heatsink; and a fan mounted to the heatsink.

25. The system of claim 24, further comprising:

a system board, with the electronic component mounted on the system board.

26. The system of claim 25, further comprising:

a circuit card connected to the system board.

27. The system of claim 25, wherein the system board comprises a motherboard and the electronic component comprises a microprocessor.

28. The system of claim 25, further comprising:

a display operably connected to the system board.

* * * * *